US007277294B2

(12) United States Patent
Carlson

(10) Patent No.: US 7,277,294 B2
(45) Date of Patent: Oct. 2, 2007

(54) CONTACTOR DRAW OUT TRAY

(75) Inventor: Kurt Nels Carlson, Bluff City, TN (US)

(73) Assignee: Electro-Mechanical Corporation, Bristol, VA (US)

( * ) Notice: Subject to any disclaimer, the term of this patent is extended or adjusted under 35 U.S.C. 154(b) by 0 days.

(21) Appl. No.: 11/337,337

(22) Filed: Jan. 23, 2006

(65) Prior Publication Data

US 2007/0173133 A1 Jul. 26, 2007

(51) Int. Cl.
*H05K 7/16* (2006.01)

(52) U.S. Cl. .................... 361/727; 200/50.2; 439/310; 439/372; 439/911; 361/726

(58) Field of Classification Search ................ 439/709, 439/310, 911, 372, 157; 361/726–727; 200/50.21, 200/50.22, 50.23, 50.24, 50.2, 50.26
See application file for complete search history.

(56) References Cited

U.S. PATENT DOCUMENTS 4,119,818 A * 10/1978 Noschese ................. 200/50.21
5,334,808 A * 8/1994 Bur et al. ................ 200/50.21
5,347,096 A * 9/1994 Bolongeat-Mobleu et al. ... 218/84
5,450,280 A * 9/1995 Wactor ....................... 361/606
5,984,716 A * 11/1999 Starkey ...................... 439/488
6,512,195 B2 * 1/2003 Domschot ................ 219/86.25
2005/0164563 A1 * 7/2005 Schuttler et al. ............ 439/709

* cited by examiner

*Primary Examiner*—Michael C. Zarroli
(74) *Attorney, Agent, or Firm*—Smith, Gambrell & Russell

(57) ABSTRACT

An electrical contactor draw out tray has a movable frame and a stationary frame in which the movable frame carries the electrical components for an electrical feeder circuit. The stationary frame is preferably housed within a power distribution center and has input terminals for the incoming electrical power and output terminals for delivering electrical power to equipment operating on the feeder circuit. The movable frame carries the contactors that control the flow of electricity through the apparatus as well as the electrical components to monitor conditions of the apparatus and various parameters for the electricity carried therein to for conditions such as short circuits, overloads, ground faults, overvoltages and undervoltages. A disconnect mechanism locks the movable frame relative the stationary frame and provides a primary means for disengaging electrical flow through the apparatus.

27 Claims, 7 Drawing Sheets

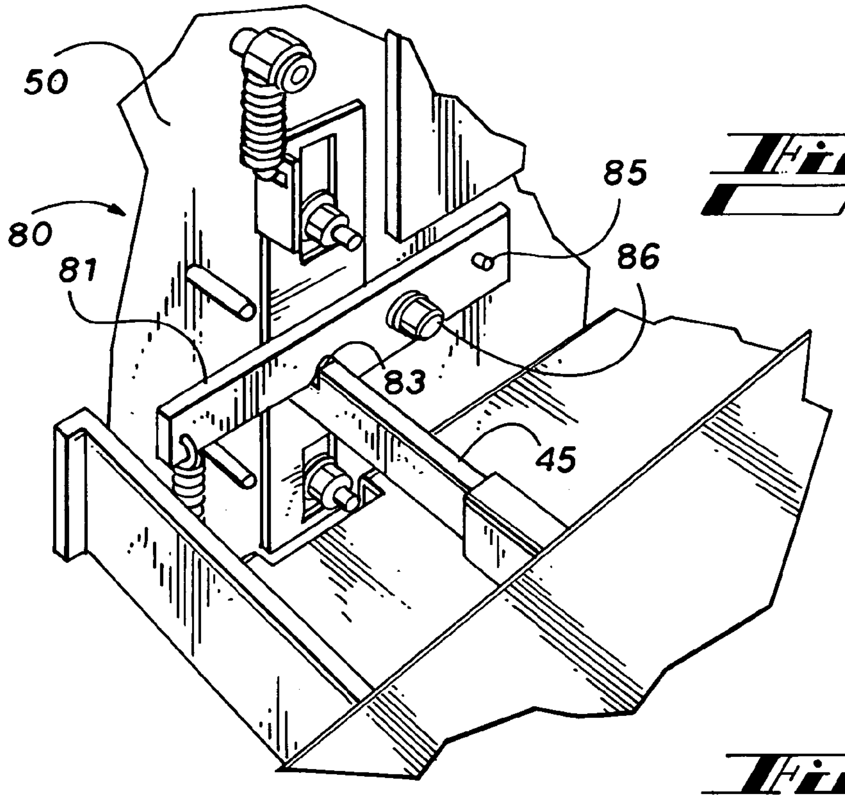
Fig_5A
Fig_5B
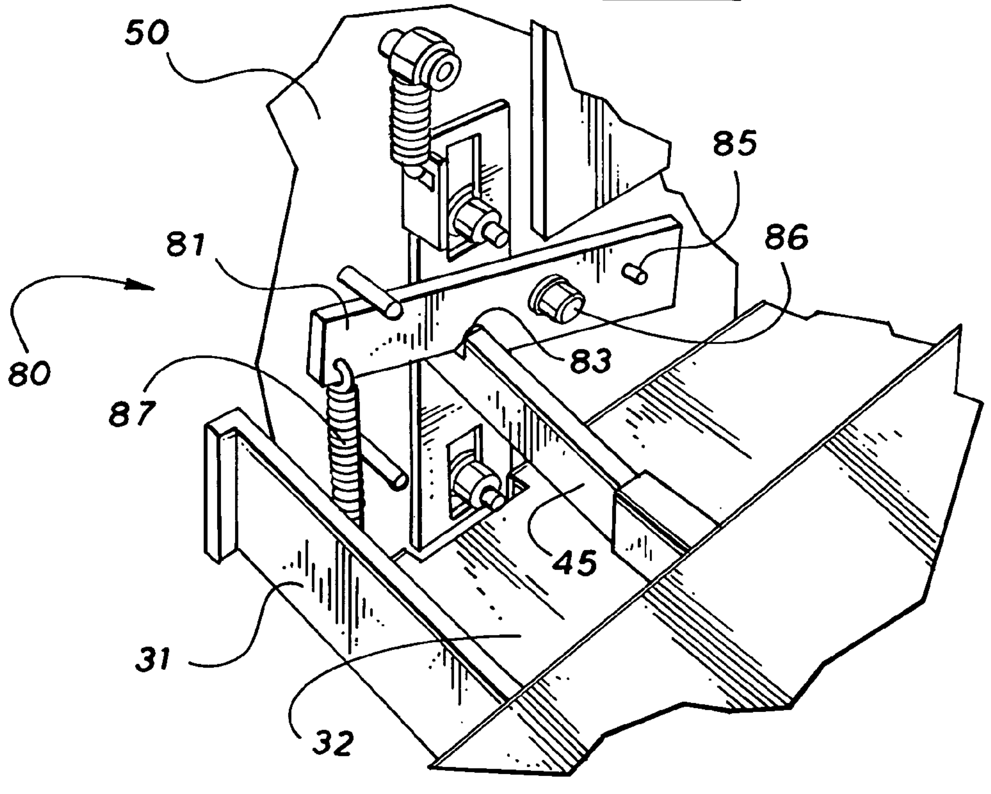

CONTACTOR DRAW OUT TRAY

FIELD OF THE INVENTION

The present invention relates to the field of electrical supply systems, and more particularly to the field of electrical feeder circuits. With even greater particularity, the invention relates to a modularized feeder circuit control panel for a power distribution center for underground mining activities.

BACKGROUND OF THE INVENTION

In electrical supply and power distribution systems and more particularly to underground mining applications utilizing the same, the repair of power distribution centers, such as longwall power centers and longwall starters is presently a difficult task. Due to the rugged and demanding environments where this equipment is normally employed, the industry has traditionally relied upon solid bolted type or hardwired connections for the operative components and circuitry in these systems. The underlying logic behind these methods is the desire to eliminate any potential weak point in the circuitry that may be compromised due to the prevalence of dust, dirt, moisture and other environmental factors.

These same environmental considerations make repair and maintenance of the equipment a difficult task. Due to the extensive size of such equipment, it is impractical to evacuate defective equipment to the surface in order to provide a clean environment for the technician to effectuate the necessary repairs. Accordingly, repairs are made on site, thereby providing further opportunity for the infiltration of contaminants into the system as the technician must open the various access panels, leaving them open for extended periods of time. Moreover, the technician is left to effectuate the repairs in the austere environment. In such conditions and as a consequence of such bolted connections, repairs remain a time consuming, labor intensive proposition. Similarly, because the equipment remains in an inoperable condition for an extended period of time, there is a concomitant loss in productivity as the equipment reliant on the electrical power is rendered useless.

While there have been efforts in the industry to modularize critical components in these systems to improve the maintainability of the systems, their use remains limited.

SUMMARY OF THE INVENTION

The apparatus of the present invention is applicable for use in electrical power supply and distribution systems, and is particularly suited for underground mining operations. The apparatus comprises: a stationary frame supporting one or more main bus terminals and a plurality of power supply output terminals in spaced relation to each other such that no electrical connection is made between the main bus terminals and the power supply output terminals. A movable frame is slidably mounted to the stationary frame and supports one or more main bus terminal connectors and a plurality of power supply output connectors. The main bus terminal connectors and supply output connectors are positioned for mating engagement with the main bus terminals and power output terminals upon selective movement of the movable frame relative to the stationary frame. A disconnect mechanism is mounted to the movable frame and provides selective electrical connection between the main bus terminal connectors and the power supply output connectors. Preferably the disconnect mechanism is operable from outside said apparatus. An observation window in the face of the front panel of the device provides for visual confirmation of the connection status of the apparatus from outside the apparatus.

The disconnect mechanism comprises one or more contactors to selectably control the electrical conductivity of the apparatus between an closed conducting position and an open position. In the open position, the disconnect mechanism preferably connects output connectors to a grounded condition.

The movable frame is configured in a tray like manner to carry the electrical conducting and controlling components of the apparatus, such that repairs may be easily made by substitution of a defective tray with an operational tray. The defective tray may then be evacuated to a suitable repair site to return it to an operational condition.

BRIEF DESCRIPTION OF THE DRAWINGS

An exemplary apparatus of the present invention is depicted in the accompanying drawings which form a portion of this disclosure and wherein:

FIG. 5A depicts a lever lock in its locking position;

FIG. 5B depicts a lever lock in its open position;

DETAILED DESCRIPTION OF THE INVENTION

Figure 1:
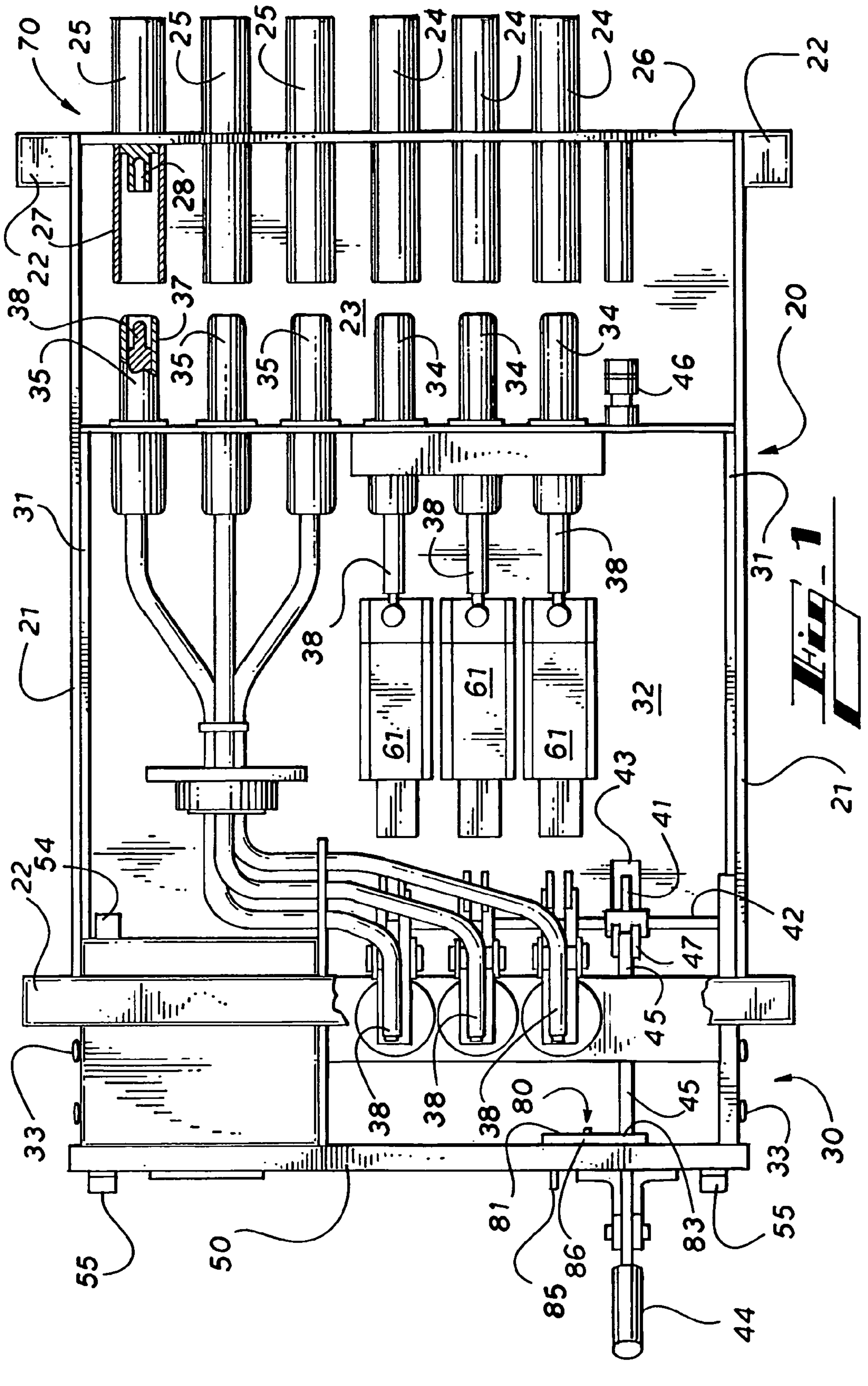
FIG. 1 depicts a plan view of a contactor tray, with the contactor tray in an open position.

Referring to the drawings for a fuller understanding of the invention, FIG. 1 shows an exemplary embodiment of an electrical contactor tray of the present invention. The contactor tray comprises a stationary frame 20, a movable frame 30, a front panel 50, and a rear panel 70.

Stationary frame 20 generally comprises a pair of longitudinal support rails 21, end supports 22, and a base plate 23 for supporting the electrical components carried by the stationary frame 20. Preferably base plate 23 will extend between support rails 21 and end supports 22 to prevent the infiltration of dust, moisture and other contaminants from beneath the apparatus which might adversely effect the longevity and performance of the electrical components.

Stationary frame 20 may further comprise a suitable enclosure (not shown) to protect the electrical components from the aforementioned environmental hazards, such that the apparatus may be utilized in a stand alone configuration. More preferably the apparatus will be utilized as component of a power distribution system, such as a longwall power center, in which case a separate enclosure would not be required.

Stationary frame 20 further provides support for one or more main bus input terminals 24, which receive electrical power inputs to the apparatus from the power distribution system or center, and one or more of power supply output terminals 25 which carry the electrical power from the apparatus to a selected piece of electrical equipment or feeder line. Terminals 24 and 25 are supported in spaced relation to each other such that no electrical connection is made between main bus input terminals 24 and power supply output terminals 25 unless an electrical connection is made through the other electrical components of the apparatus. That is, terminals 24 and 25 are mounted to the apparatus such that they are electrically isolated from each other and the apparatus. In the particular embodiment shown, terminals 24 and 25 are mounted in a linear arrangement on an isolating support member 26, and is by no means limiting. Preferably, isolating support member 26, will serve as the rear panel 70, to which the respective input and output power cables are connected.

Movable frame 30 comprises a pair of longitudinal support members 31 extending from front panel 50 and a support tray 32 disposed between support members 31 and front panel 50. Support members 31 are selected to cooperatively engage longitudinal support rails 21 such that movable frame 30 is slidable relative to and within stationary frame 20. Preferably, one or more rollers 33 are attached to each longitudinal support member 31, such that rollers 33 engage longitudinal support rails 21 in rolling contact, permitting relatively easy movement of moveable frame 30 between an open and a closed position.

The support tray 32 of movable frame 30 provides support and mounting for one or more main bus input connectors 34 and one or more power output connectors 35 in spaced relation and positioned for mating engagement with main bus input terminal 24 and said output terminal 25 upon movement of movable frame 30 to a closed position relative to stationary frame 20. In the embodiment shown, connectors 34 and 35 and terminals 24 and 25 are standard heavy duty male and female insulated connectors having an outer insulating layer 27 and 37, and a conductor 28 and 38 disposed internally of the insulating layers 27 and 37.

Electrical connection between main bus input connector 34 and power output connector 35 is provided via a disconnect mechanism 40, selectable between a closed, conducting position, and an open position. In the embodiment shown, standard heavy duty switch gear 60 having contactor 61 is interposed between input connectors 34 and output connectors 35, with connectors 34 and 35 communicating with the contactor 61 via a conductor 38, such as a heavy duty electrical cables. With the engagement of connectors 34 and 35 to terminals 24 and 25 upon closure of the movable frame 30, selective electrical conductivity is provided between the main bus input terminals 24, providing the incoming electrical power source, and the power output terminals 25, feeding the electrical power to the equipment, via switch gear 60 and associated contactors 61.

Figure 3:
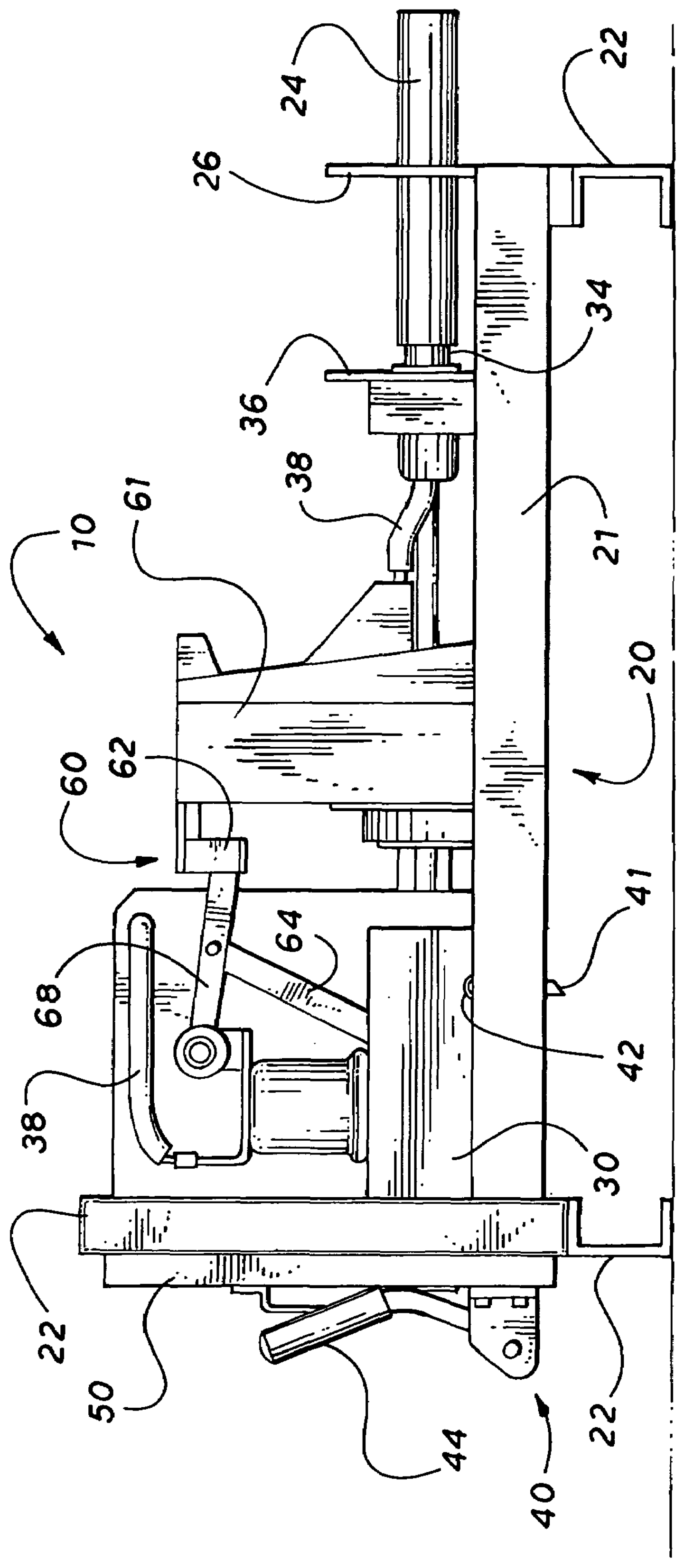
FIG. 3 is a right side view of a contactor tray with the tray in a closed position and the contactor in closed position.
Figure 4:
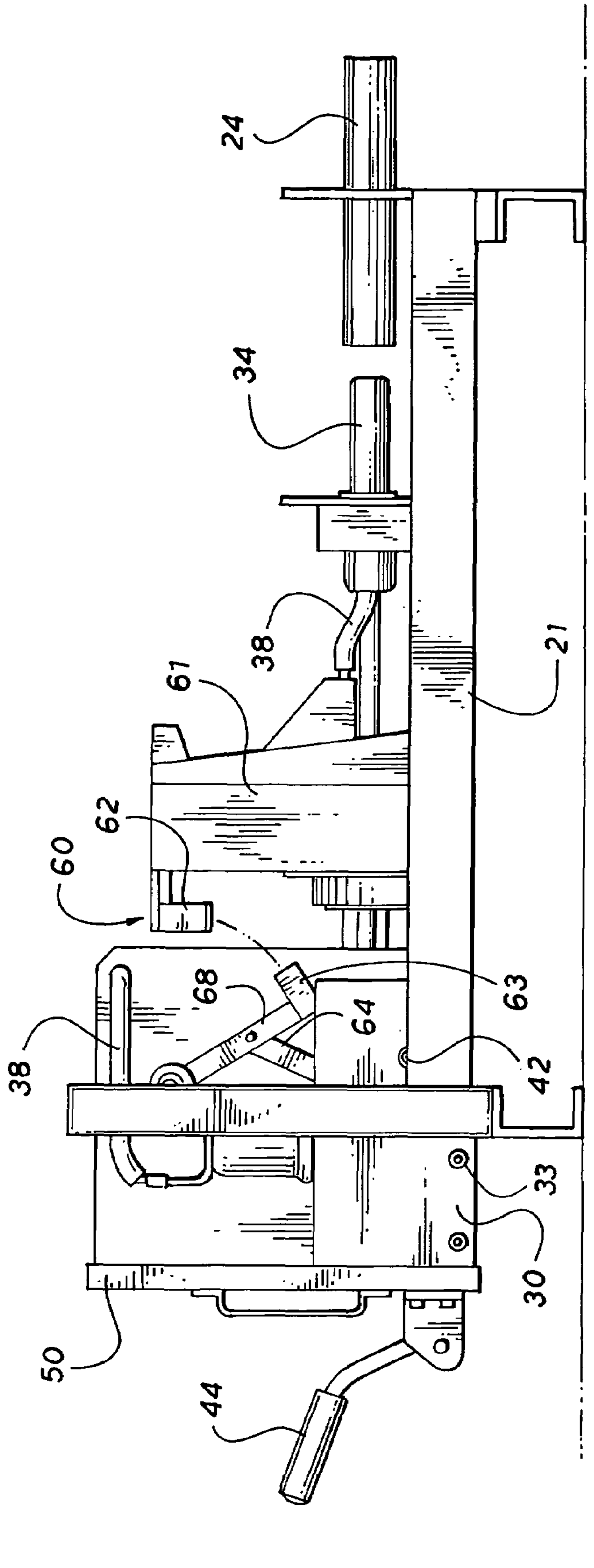
FIG. 4 is a right side view of a contactor tray with the tray in an open position and the contactor in an open position.

Switch gear 60 and contactors 61 are supported by and movable with support tray 32 and provide an electrically isolated conductive pathway for the electrical power carried by the apparatus. As may be seen in reference to FIGS. 3 and 4, switch gear 60 and contactor 61 are positioned on support tray 32, such that the switch gear selectable conducting contacts 62 and open circuit contacts 63 are positioned facing front panel 50. Preferably, open circuit contacts 63 are connected to an electrical ground such that power output terminals 25 and their corresponding feeder cables are automatically grounded upon operation of disconnect mechanism 40.

Figure 2:
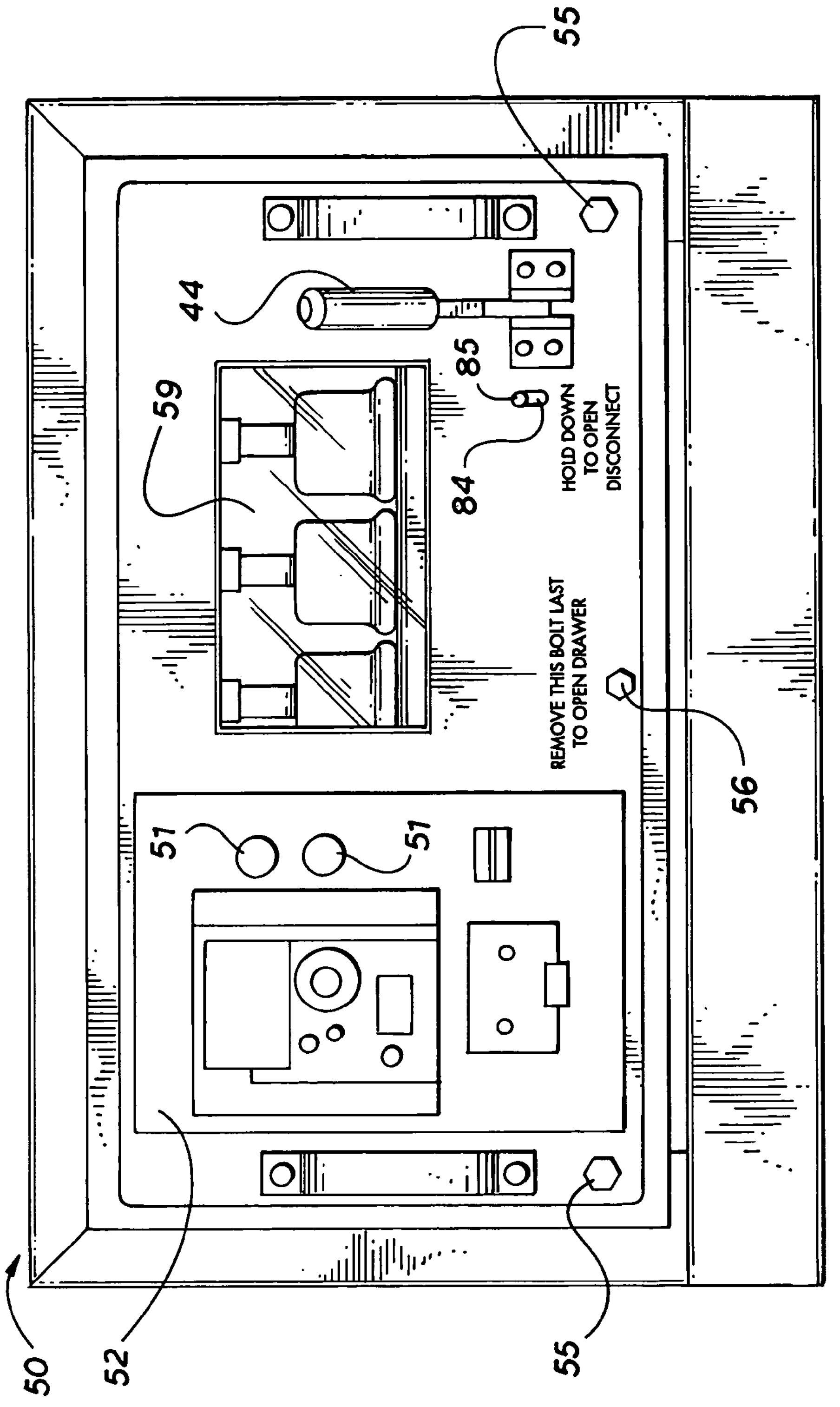
FIG. 2 depicts frontal view of a contactor tray.

As best seen in FIGS. 1, 5 and 6, an exemplary disconnect mechanism 40 of the present invention further comprises an actuating lever 44 operatively coupled to a switch gear conducting arm 68, such that contactors 61 are selectably engageable from external the apparatus. Actuating lever 44 is operatively coupled to conducting arm 68 via an actuating rod 45, torque arms 47, and torque shaft 42, such that conducting arm 68 is operable between conducting contacts 62 and open circuit contacts 63, via an insulated actuator arm 64. As may be seen in reference to FIG. 2, a window 59 in the face of front panel 50 permits the operator to visibly inspect and confirm the conducting state of contactor 61 by observing the position of switch gear conducting arm 68.

For mining applications in particular, it is desirable that any spark that may be developed as a consequence of breaking electrical conduction through the apparatus be contained within the enclosure or host distribution panel so as to reduce the risk of explosion. More preferably, contactor 61 is a spark arresting type, such as a vacuum break, such that opening disconnect 40 will automatically open contactor 61, forcing any load break arching to be contained within the vacuum bottles of the contactor 61. This may be accomplished by one or more limit switches 65 sensing and communicating the selected position of disconnect mechanism 40 to contactor 61. An exemplary limit switch 65 is shown in FIG. 6A, wherein a cam 48, attached to torque shaft 42 contacts limit switch 65 upon the repositioning of actuating lever 44 between its open and closed positions.

For safety and other operational considerations, electrical conduction between input terminals 24 and output terminals 25 should be broken before movable frame 30 is repositioned within stationary frame 20. This is done so as to prevent arching between terminals 24 & 25 and their associated connectors 34 & 35 as they are electrically coupled or decoupled when the movable frame 30 is repositioned within stationary frame 20. Accordingly, disconnect mechanism 40 should further comprise one or more interlocks to limit movement of movable frame 30 to conditions when conductivity between input terminal 24 and output terminals 25 has been broken.

Figure 6A:
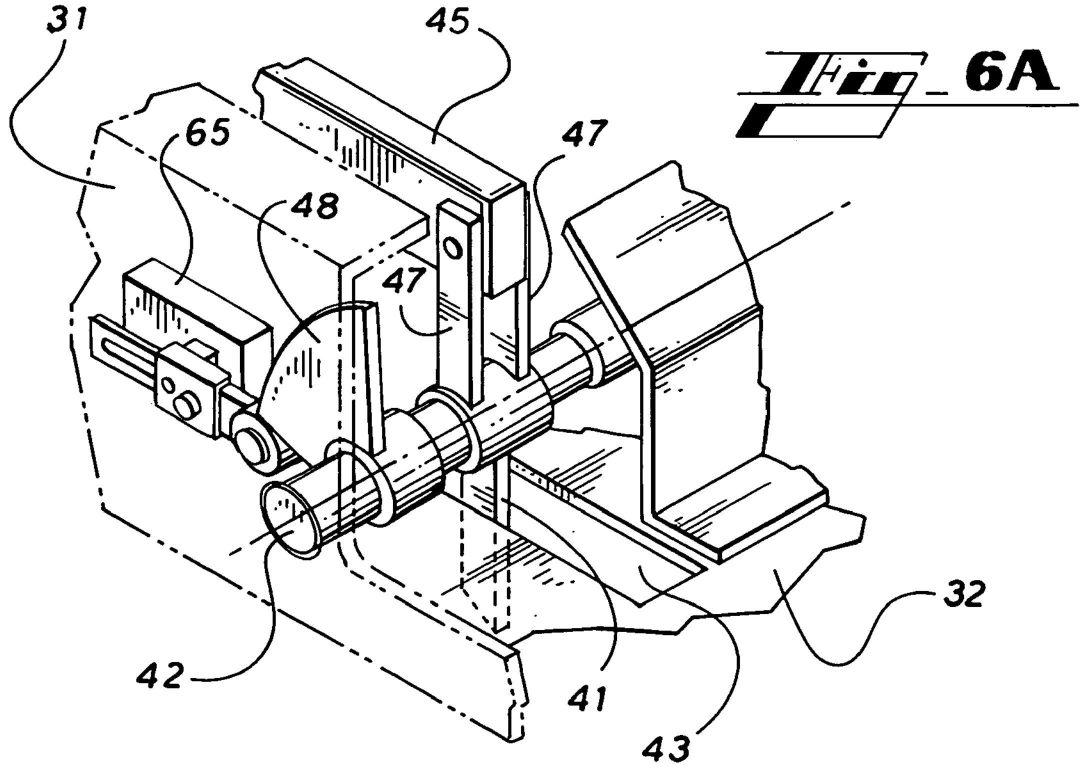
FIG. 6A depicts a mechanical interlock in a locked position.
Figure 6B:
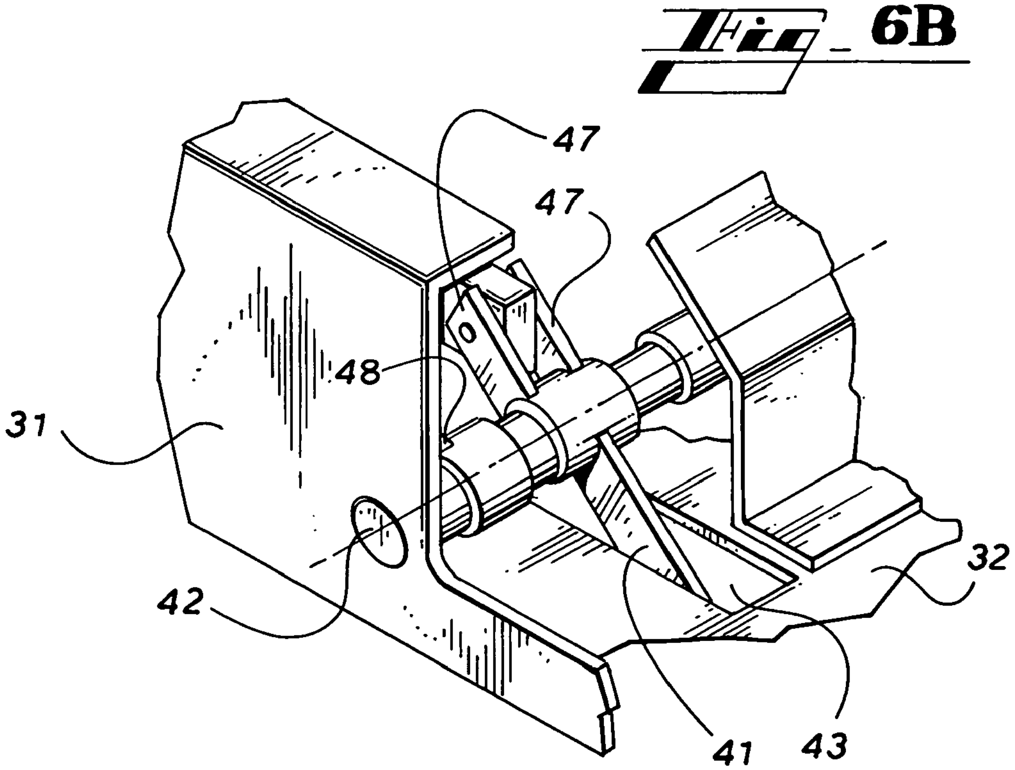
FIG. 6B depicts a mechanical interlock in an open position.
Figure 7:
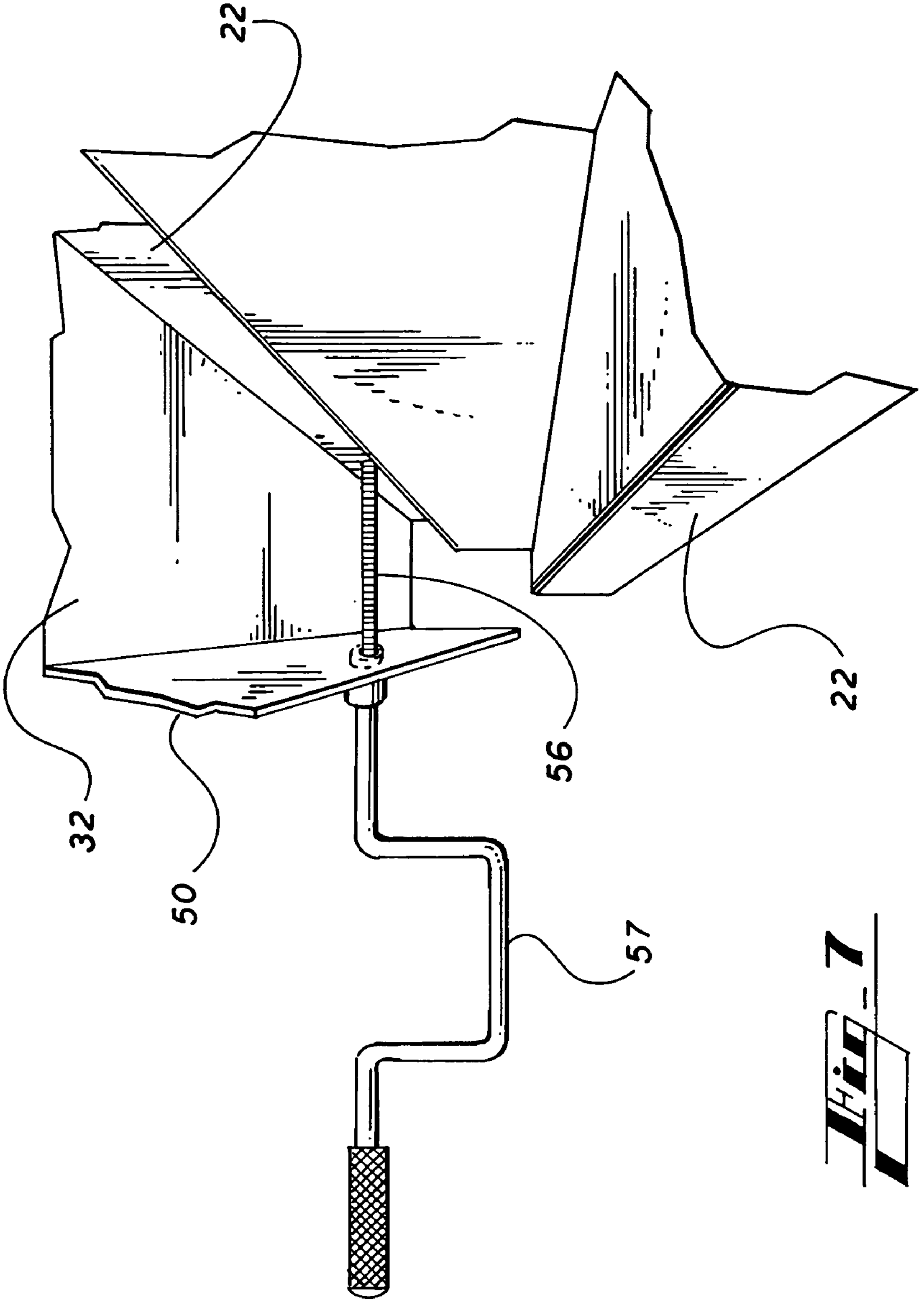
FIG. 7 depicts a worm screw actuator for opening and closing the movable frame relative the stationary frame.

An exemplary mechanical interlock may be seen in reference to FIGS. 6A and 6B wherein disconnect mechanism 40 is provided with detent flange 41 extending from torque shaft 42 such that when actuating lever 44 is in the closed position detent flange 41 extends through a slot 43 defined in support tray 32. When movable frame 30 is in a closed position, detent flange 41 engages with stationary frame 20 and restricts movement of movable frame 30. As previously discussed, movement of actuating lever 44 to its open position automatically opens contactors 61 to a non-conducting condition. Movement of actuating lever 44 to an open position retracts detent flange 41 from engagement with stationary frame 20 and permits the movable frame 30 to be withdrawn without risk of arching.

Alternatively, disconnect mechanism 40 may further comprise an electro-mechanical interlock 46, seen in FIG. 1, such that withdrawal of movable frame 30 from its closed position is precluded when contactor 41 is in its closed, conducting position. Alternatively, electrical interlock 46 may sense the conducting state of contactor 41 and communicate to operate an electrical locking device such as a pin or stop selectively positioned by a servo, solenoid or the like.

In addition to the aforementioned spark hazard, exposure of personnel to the high voltage electricity carried by the apparatus is also a hazard. In this regard, repositioning movable frame 30 to its open position will automatically break electrical connectivity between terminals 24 and 34 and their associated connectors 25 and 35 such that no electrical load can carried by contactor 61 and its associated conductors 38. The components of the movable tray may then be repaired without risk of electrical shock to maintenance personnel.

For maintenance and diagnostic purposes, it is often desirable to be able to test the functioning of switch gear 60 and contactors 61 and other sensors, relays, and electrical components while the movable frame 30 is open. In order to do so, it is necessary that actuating lever 44 be placed in its closed position such that limit switches 65 may be closed. In this condition, inadvertent closure of the movable tray 30 and possible engagement of terminals 24 & 25 with connectors 34 & 35, would potentially reintroduce both the spark and electrical shock hazards to the environment. Accordingly, a mechanical stop to prevent inadvertent closure of movable frame 30 is highly desirable. In this regard, the exemplary mechanical detent flange 41 also serves to prevent inadvertent closure of movable frame 30. As may be seen in reference to FIGS. 1 and 3, with actuating lever 44 in the closed position, detent flange 41 again extends through slot 43. However, in this instance for the exemplary embodiment shown, detent flange 41 engages with the front of stationary frame 20 to prevent repositioning of movable frame 30 to a point where terminals 24 & 25 and connectors 34 & 35 would remain decoupled and would not present a spark hazard due to arching.

To prevent inadvertent movement of actuating lever 44, a mechanical stop may optionally be provided. As may be seen in reference to FIGS. 2, 5*a* and 5*b*, an exemplary lever lock 80 is shown which prevents inadvertent movement of actuating lever 44. Lever lock 80 comprises a locking arm 81 attached to a pivot 86 extending from the rear surface of front panel 50. Locking arm 81 engages with a notch 83 defined in actuating rod 45 which restricts movement of actuating lever 44. A release pin 85 extends from an opposite end of locking arm 81 and extends through a slot 84 defined in front panel 50 such that movement of release pin 85 disengages locking arm 81 from notch 83 permits movement of actuating lever 44.

As an added safeguard, movable frame 30 should be secured to stationary frame 20 so that only properly authorized personnel are provided access to open the tray for servicing or otherwise. This may be achieved by one or more bolts or pins 55 securing front panel 50 to stationary frame 30. Due to the extreme operating conditions contemplated for the apparatus, over time terminals 24 and 25 may become difficult to disengage from connectors 34 and 36 or the interface between rails longitudinal support rails 21, longitudinal support members 31, and rollers 33 may become such that the apparatus is difficult to open. To alleviate these difficulties, the apparatus may be provided with an actuator 56, such as a worm screw, operatively coupled between front panel 50 and stationary frame 20 such that actuator 56 will disengage movable frame 30 from stationary frame 20. Actuator 56 may also be utilized in a reverse direction to draw the movable frame 30 into stationary frame 20 to securely close the apparatus and ensure full engagement of terminals 24 and 25 with connectors 34 and 35. Actuator 56 may be rotated by a wrench 57 or other suitable means.

In mining applications in particular, the environmental and operational constraints make repair of the electrical components of the apparatus within the confines of the mine a difficult endeavor. A particularly useful aspect of the present invention concerns the rapid repair or replacement of a defective apparatus such that the process for which the electrical power is provided experiences minimal interruption. Because the operative electrical components are carried by the movable frame 30 in a modular package, a defective assembly may be quickly replaced by completely removing the defective movable frame 30, and replacing it with an operational one, thereby permitting rapid resumption of the production process. The defective components may then be repaired by evacuating movable frame 30 to a more suitable repair site or facility.

Controls 51 for operating the apparatus are mounted on front panel 50, such that the device may be readily controlled when the apparatus is inserted into a power distribution panel, which would otherwise block access to the same. In operating feeder circuits such as that disclosed in the present invention, it is desirable to monitor conditions of the apparatus and various parameters for the electricity carried therein to for conditions such as short circuits, overloads, ground faults, overvoltages and undervoltages.

These parameters and the apparatus conditions may be monitored or controlled by a controller 52 integrally mounted to front panel 50. Controller 52 may contain integrated logic circuitry and protective relays such that the apparatus is capable of controlling and monitoring its electrical condition independent of a host power distribution system. Additionally, controller 52 may communicate its electrical condition and status to a host power distribution center via electrical, fiber optic or other suitable cabling. It may also receive and respond to control signals via such cables. Alternatively, the apparatus may contain a transmitter and/or receiver to accomplish the same end. In either case, it may be desired to provide complete remote control of the apparatus via computer interface of all functions, relay settings, and data acquisition. In the case where a control cable (not shown) is utilized to provide control and/or monitoring of the apparatus, the cable should be detachably coupled to the controller 52 via a control cable interface 54, such that the movable frame 30 may be readily removed. Thus, movable frame 30 is preferably equipped to carry all the necessary circuitry, sensing devices and protective relaying for an entire feeder circuit. This configuration will permit rapid repair of a defective feeder circuit by substitution of an operable one.

Because power distribution systems and the equipment dependent thereon may require feeder circuits having varying electrical inputs, outputs, conditioning or tolerances, it is preferred that the electrical components of a given movable frame 30 be matched to the required parameters. To accomplish this, movable frame 30 should be matched to the corresponding stationary frame 20. For example, movable frame 30 may be keyed to stationary frame 20 such that only a movable frame 30 with compatible electrical components will fit within fixed frame 20. Such a configuration is desirable to preclude, for example, a tray with a 200 amp rating being inserted into a feed designed to run 600 amp equipment. Alternatively, the spaced alignment of terminals 24 & 25 supported by stationary frame 20 may be keyed to a set of desired operating characteristics for the feeder circuit or power distribution system. In this case, a movable frame 30 carrying a compatible set of electrical components, corresponding to the desired set of operating characteristics for the feeder circuit will have its connectors 34 & 35 aligned for engagement with terminals 24 & 25. The alignment of connectors 34 & 35 on an incompatible tray would not engage with terminals 24 & 25. A similar result could be obtained with a slot and pin arrangement wherein the movable tray 30 could only engage stationary frame 20 when the slot and pin of compatible units are aligned. A preferred embodiment of this is shown in FIG. 1 wherein pin 26 is aligned for engagement with a coupling 46 such that contact between of pin 26 and coupling 46 carries a control signal to enable the electrical components of movable tray 30.

Alternatively, where control circuitry is utilized, the electrical components carried by movable frame 30 may be programmably configured such that its variable parameters may be automatically configured to match the newly inserted tray to the particular parameters required based on its position within the power distribution system. In this regard, carriage of all the necessary components for a desired feeder circuit on movable frame 30 permits a rapid reconfiguration of the feeder circuit to one with the desired operating parameters.

It is to be understood that the form of the invention shown is a preferred embodiment thereof and that various changes and modifications may be made therein without departing from the spirit of the invention or scope as defined in the following appended claims:

I claim:

1. An apparatus for use in an electrical distribution system comprising in combination:

a. a stationary frame supporting one or more main bus input terminals and one or more of power output terminals in spaced relation to each other such that no electrical connection is made between said main bus input terminals and said power output terminals;

b. a movable frame slidably carried on said stationary frame and supporting one or more main bus input connectors and one or more power output connectors positioned for mating engagement with said main bus input terminal and said power supply output terminal upon selective movement of said movable frame along said stationary frame; and c. a disconnect mechanism mounted to said movable frame and visible from the exterior of the apparatus, said disconnect mechanism providing selective electrical connection between said main bus input connectors and said power output connectors, said disconnect mechanism being operable from outside said apparatus, wherein said disconnect mechanism selectively operates between an open position and a closed position such that in said open position said main bus input terminal connector is electrically disconnected from said power supply output connector.

2. The apparatus of claim 1, wherein said disconnect mechanism electrically connects said power supply output connector to a ground, when said disconnect mechanism is in said open position.

3. The apparatus of claim 1, wherein said disconnect mechanism locks said movable frame relative said stationary frame when said disconnect mechanism is in said closed position.

4. The apparatus of claim 1, wherein said disconnect mechanism further comprises one or more contactors, each said contactor providing selective electrical connection between a closed conducting position and an open non-conducting position.

5. The apparatus of claim 4, wherein said contactor is selectably closeable when said disconnect mechanism is in said closed position.

6. The apparatus of claim 4, wherein said contactor is not closeable when said disconnect mechanism is in said open position.

7. The apparatus of claim 4, wherein said contactor electrically connects said main bus input terminal connector and said power supply output connector when said contactor is in its closed position.

8. The apparatus of claim 4, wherein said contactor is selectively positionable in response to a signal communicated to said contactor.

9. The apparatus of claim 8, further comprising a control panel communicating said signal to said contactor.

10. The apparatus of claim 9, wherein said control panel further comprises communication means for receiving a control signal from said electrical distribution system and said control panel is responsive to said control signal to communicate said signal to said contactor.

11. The apparatus of claim 10, wherein said communication means comprise a wire harness attached to said control panel and said electrical distribution system.

12. The apparatus of claim 10, wherein said communication means comprise a receiver.

13. An apparatus for use in an electrical distribution system comprising in combination:

a. a stationary frame supporting one or more main bus input terminals and one or more of power output terminals in spaced relation to each other such that no electrical connection is made between said main bus input terminals and said power output terminals;

b. a movable frame slidably carried on said stationary frame and supporting one or more main bus input connectors and one or more power output connectors positioned for mating engagement with said main bus input terminal and said power supply output terminal upon selective movement of said movable frame along said stationary frame;

c. a disconnect mechanism mounted to said movable frame and visible from the exterior of the apparatus, said disconnect mechanism providing selective electrical connection between said main bus input connectors and said power output connectors, said disconnect mechanism being operable from outside said apparatus; and d. a control panel for monitoring an electrical condition of said apparatus.

14. The apparatus of claim 13, wherein said control panel further comprises communication means for communicating said electrical condition to said electrical distribution system.

15. The apparatus of claim 14, wherein said communication means comprise a wire harness attached between said control panel and said electrical distribution system.

16. The apparatus of claim 14, wherein said communication means comprise a transmitter.

17. An apparatus for use in an electrical distribution system comprising in combination:

a. a stationary frame supporting one or more main bus input terminals and one or more of power output terminals in spaced relation to each other such that no electrical connection is made between said main bus input terminals and said power output terminals;

b. a movable frame slidably carried on said stationary frame and supporting one or more main bus input connectors and one or more power output connectors positioned for mating engagement with said main bus input terminal and said power supply output terminal upon selective movement of said movable frame along said stationary frame, wherein said movable frame is positionable relative said stationary frame by an actuator operable from external said apparatus; and c. a disconnect mechanism mounted to said movable frame and visible from the exterior of the apparatus, said disconnect mechanism providing selective electrical connection between said main bus input connectors and said power output connectors, said disconnect mechanism being operable from outside said apparatus.

18. The apparatus of claim 17 wherein said actuator comprises a worm screw.

19. An apparatus for use in an electrical distribution system comprising in combination:

a. a stationary frame supporting one or more main bus input terminals and one or more of power output terminals in spaced relation to each other such that no electrical connection is made between said main bus input terminals and said power output terminals;

b. a movable frame slidably carried on said stationary frame and supporting one or more main bus input connectors and one or more power output connectors positioned for mating engagement with said main bus input terminal and said power supply output terminal upon selective movement of said movable frame along said stationary frame, wherein said movable frame is keyed to said stationary frame such that said movable frame is mountable to said stationary frame only when a set of electrical components mounted to said movable frame are compatible with a set of desired operating parameters for said electrical distribution system; and c. a disconnect mechanism mounted to said movable frame and visible from the exterior of the apparatus, said disconnect mechanism providing selective electrical connection between said main bus input connectors and said power output connectors, said disconnect mechanism being operable from outside said apparatus.

20. An apparatus for use in an electrical distribution system comprising in combination:

a. a stationary frame supporting one or more main bus input terminals and one or more of power output terminals such that no electrical connection is made between said main bus input terminals and said power output terminals and said main bus input terminals and said power output terminals are supported in a specified spaced relation according to a set of desired operating parameters for said electrical distribution system;

b. a movable frame slidably carried on said stationary frame and supporting one or more main bus input connectors and one or more power output connectors positioned for mating engagement with said main bus input terminal and said power supply output terminal upon selective movement of said movable frame along said stationary frame; and c. a disconnect mechanism mounted to said movable frame and visible from the exterior of the apparatus, said disconnect mechanism providing selective electrical connection between said main bus input connectors and said power output connectors, said disconnect mechanism being operable from outside said apparatus.

21. The apparatus of claim 20, wherein said movable frame supports said main bus input connectors and said power output connectors in said specified spaced relation only when said movable frame supports a set of electrical components compatible with said set of desired operating parameters for said electrical distribution system.

22. An apparatus for use in an electrical distribution system comprising: a stationary frame supporting one or more main bus input terminals and one or more of power output terminals in spaced relation to each other; a movable frame slidably mounted to said stationary frame and supporting one or more main bus input connectors and one or more power output connectors positioned for mating engagement with said main bus input terminal and said power supply output terminal upon selective movement of said movable frame into said stationary frame; and a disconnect mechanism mounted to said movable frame and being operable from external said apparatus, said disconnect mechanism providing selective electrical connection between said main bus input connectors and said power output connectors, said selective electrical connection visible from outside said apparatus, and said disconnect mechanism controlling movement of said movable frame relative said stationary frame.

23. A feeder circuit comprising a movable frame supporting one or more main bus input connectors, one or more power output connectors and one or more electrical contactors positioned between and providing selective electrical conduction between each said main bus input connector and each said power output connector, said movable frame carried on a stationary frame adapted for slidably receiving said movable frame, said stationary frame having one or more main bus input terminals and one or more power output terminals aligned for mating engagement with said main bus input connectors and said power output connectors; a disconnect mechanism mounted to said movable frame, said disconnect mechanism selectable between an open position and a closed position and in said closed position, said disconnect mechanism permits electrical conduction between said main bus input connector and said power output connector.

24. A feeder circuit comprising a movable frame supporting one or more main bus input connectors, one or more power output connectors and one or more electrical contactors positioned between and providing selective electrical conduction between each said main bus input connector and each said power output connector said movable frame carried on a stationary frame adapted for slidably receiving said movable frame, said stationary frame having one or more main bus input terminals and one or more power output terminals aligned for mating engagement with said main bus input connectors and said power output connectors; a disconnect mechanism mounted to said movable frame, said disconnect mechanism selectable between an open position and a closed position and in said closed position, said contactor is selectable to a conducting state.

25. A feeder circuit comprising a movable frame supporting one or more main bus input connectors, one or more power output connectors and one or more electrical contactors positioned between and providing selective electrical conduction between each said main bus input connector and each said power output connector, said movable frame carried on a stationary frame adapted for slidably receiving said movable frame, said stationary frame having one or more main bus input terminals and one or more power output terminals aligned for mating engagement with said main bus input connectors and said power output connectors; a disconnect mechanism mounted to said movable frame, said disconnect mechanism selectable between an open position and a closed position, wherein with said disconnect mechanism in said open position said movable frame is repositionable relative said stationary frame.

26. A feeder circuit comprising a movable frame supporting one or more main bus input connectors, one or more power output connectors and one or more electrical contactors positioned between and providing selective electrical conduction between each said main bus input connector and each said power output connector, said movable frame carried on a stationary frame adapted for slidably receiving said movable frame, said stationary frame having one or more main bus input terminals and one or more power output terminals aligned for mating engagement with said main bus input connectors and said power output connectors, a disconnect mechanism mounted to said movable frame, said disconnect mechanism selectable between an open position and a closed position, wherein in said open position said disconnect mechanism connects said power output connector to a ground.

27. A feeder circuit comprising a movable frame supporting one or more main bus input connectors, one or more power output connectors and one or more electrical contactors positioned between and providing selective electrical conduction between each said main bus input connector and each said power output connector, said movable frame carried on a stationary frame adapted for slidably receiving said movable frame, said stationary frame having one or more main bus input terminals and one or more power output terminals aligned for mating engagement with said main bus input connectors and said power output connectors; a disconnect mechanism mounted to said movable frame, said disconnect mechanism selectable between an open position and a closed position, wherein with said disconnect mechanism in said open position, said contactor is not selectable to a conducting state.

* * * * *